United States Patent [19]

Simmonds

[11] Patent Number: 5,518,835
[45] Date of Patent: May 21, 1996

[54] DEVICE FOR INDICATING THE RESIDUAL CAPACITY OF SECONDARY CELLS

[75] Inventor: Stewart N. Simmonds, Port Coquitlam, Canada

[73] Assignees: 4C Technologies Inc., Port Coquitlam, Canada; Datalink Corporation, Tokyo, Japan

[21] Appl. No.: 211,208
[22] PCT Filed: Jul. 23, 1993
[86] PCT No.: PCT/JP93/01035
  § 371 Date: Jul. 19, 1994
  § 102(e) Date: Jul. 19, 1994
[87] PCT Pub. No.: WO94/02968
  PCT Pub. Date: Feb. 3, 1994

[30] Foreign Application Priority Data

Jul. 23, 1992 [JP] Japan ................................ 4-197046

[51] Int. Cl.⁶ .............................. H02J 7/04; G01N 27/00
[52] U.S. Cl. ............................ 429/90; 429/91; 429/92; 429/93; 320/20; 320/30; 320/39; 320/43; 320/48; 324/426; 324/427; 324/433
[58] Field of Search ........................ 429/90, 91, 92, 429/93; 324/426, 427, 433; 320/48, 39, 30, 20, 43

[56] References Cited

U.S. PATENT DOCUMENTS

| | | | |
|---|---|---|---|
| 4,677,363 | 6/1987 | Kopmann | 320/20 |
| 4,806,840 | 2/1987 | Alexander et al. | 320/20 |
| 4,843,299 | 6/1989 | Hutchings | 320/39 |
| 4,947,123 | 8/1990 | Minezawa | 320/48 |
| 5,157,320 | 10/1992 | Kuriloff | 320/39 |
| 5,200,690 | 6/1993 | Uchida | 320/20 |
| 5,274,321 | 12/1993 | Matsuda | 320/48 |

FOREIGN PATENT DOCUMENTS

| | | |
|---|---|---|
| 58-182171 | 12/1983 | Japan. |
| 2-262078 | 10/1990 | Japan. |
| 4-292870 | 10/1992 | Japan. |

*Primary Examiner*—Lee C. Wright
*Attorney, Agent, or Firm*—Wallenstein & Wagner, Ltd.

[57] ABSTRACT

A device for and a method of indicating the residual capacity of a secondary cell, that needs be recharged using a simply constituted device, correctly and within a short period of time. The device 1 for indicating the residual capacity comprises a power source feeding means 6, a cell-holding means 7, a terminal voltage measuring means 8, a sampling means 9 for measuring the terminal voltage of the cell 2 while the power source feeding means 6 is feeding a current to the cell, a storage means 10 storing a look-up table 100 which is specific to the kind of the cell 2 of which the residual capacity is to be measured and shows a relationship between a group of specific sections that are divided to represent the ranges of the residual capacity of the cell and the specific voltage regions corresponding to the specific sections, an operation means 11 which compares the measured voltage value with the specific voltage regions in the look-up table, successively, to judge the residual capacity of the cell, and an indicator means which operates in response to the output of the operation means 11.

22 Claims, 7 Drawing Sheets

Fig.3

| SECTIONS DESIGNATING RESIDUAL CAPACITY RANGES | SECTIONS OF VOLTAGE REGIONS |
|---|---|
| 0 ~ 15 % | $V_1$ ~ $V_2$ (V) |
| 15 ~ 30 % | $V_2$ ~ $V_3$ (V) |
| 30 ~ 45 % | $V_3$ ~ $V_4$ (V) |
| ~ | |
| ⋮ | ⋮ |
| 90 ~ 100 % | $V_{n-1}$ ~ $V_n$ (V) |

Fig.4

| SECTIONS DESIGNATING RESIDUAL CAPACITY RANGES | SECTIONS OF VOLTAGE REGIONS |
|---|---|
| 0 ~ 15 % | 6.0V ~ 8.8 V |
| 15 ~ 30 % | 8.8V ~ 8.9 V |
| 30 ~ 45 % | 8.9V ~ 9.0 V |
| 45 ~ 60 % | 9.0V ~ 9.1 V |
| 60 ~ 75 % | 9.1V ~ 9.3 V |
| 75 ~ 90 % | 9.3V ~ 9.6 V |
| 90 ~ 100 % | 9.6V ~ 10.0V |

DEVICE FOR INDICATING THE RESIDUAL CAPACITY OF SECONDARY CELLS

TECHNICAL FIELD

The present invention relates to a device for indicating the residual capacity of nickel-cadmium cells and to a method of indicating the residual capacity of nickel-cadmium cells.

BACKGROUND ART

Secondary cells such as nickel-cadmium cells and nickel-hydrogen cells are recharged many times throughout their service life. The recharging operation must be carefully controlled in order to minimize the harmful effects that have been known among people skilled in the art (see, for example, "Charging Storage Cells: Life-Extending Ability", Bob Williams, Cellular Business, April, 1989, pp. 44–49). In the early stage of the secondary cell recharging technology, the recharging operation consumed a time as long as several hours. As consumer devices powered by the secondary cells became more widely used, however, it was necessary to develop a system that was capable of recharging the secondary cells not in hours but in minutes. Though it is possible to "quick charge" the secondary cells, more careful monitoring and control are necessary for the cell recharging process in order to prevent irreversible damage to the cells (see, for example, "Latest Information on Nickel-Cadmium Cells", September, 1990 Report in Brussels Seminar, Cadmium Association, November, 1990, London, U.K.).

There have heretofore been developed a variety of secondary cell recharging systems for quickly recharging secondary cells. These systems generally employ an electric circuit that monitors the voltage and/or the temperature of the cell that is being recharged and interrupts the supply of a charging current and/or changes the charging current to the cell when the temperature or the voltage thereof has reached a predetermined level. A representative prior art has been disclosed in U.S. Pat. No. 4,006,397 assigned to Catotti et al.

Furthermore, Japanese Patent Publications Nos. 23528/1987 and 23529/1987 disclose methods of recharging secondary cells such as nickel-cadmium cells wherein, during the recharging operation, attention is given to a change in the voltage waveform of the cells, a plurality of inflection points appearing in the voltage waveform are stored in advance, and the charging operation is interrupted when the plurality of the stored inflection points have occurred in a predetermined order. According to the above methods, however, changes in the voltage waveform during the charging operation must be recorded in advance for each of various kinds of the cells, and the stored content must be rewritten into a form that corresponds to the cell prior to executing the charging operation depending upon the kind of the cell that is to be recharged, requiring cumbersome operation. Depending upon the environment in which the charging operation is carried out and the hysteresis of the cell, furthermore, the waveform of the output voltage of the cell often does not exhibit the order or magnitude of waveforms as stored. It is not, therefore, able to properly carry out the charging operation or the recharging operation and, hence, the high-speed charging operation could not be executed without deteriorating the cell performance.

That is, the secondary cells and, particularly, the nickel-cadmium cells or the nickel-hydrogen cells have required a recharge time of, usually, six hours to 16 hours in the longest case. A time of one to two hours is required even by the so-called high-speed charging method that is intended to recharge the cells within relatively short periods of time.

When rechargeable cells, storage cells and batteries are being recharged for their respective purposes, the charging time is best kept as short as possible. Due to the bottlenecks such as the rise in temperature stemming from the principle of chemical reaction inside the secondary cell and the rise in the internal pressure, however, it is not possible to charge the cell within short periods of time by flowing a large current as it results in the destruction of the cell or in the degradation of the cell characteristics, i.e., output characteristics and charging characteristics.

In recent years, however, the secondary cells have become in demand in various fields of industries and, particularly, in the sites where machine tools are used, in the hospitals where medical appliances are used and in the communication business inclusive of mobile telephones. In these fields of use, the power source must not fail during use, and it a secondary cell that can be recharged at high speeds or, desirably, that can be recharged instantaneously, is required.

The object of the present invention, therefore, is to easily recharge a secondary cell and, particularly, the nickel-cadmium cell or the nickel-hydrogen cell within a period of time which is as short as about several minutes and not longer than 20 minutes by improving the above-mentioned defects inherent in the prior art. The recharging at this very high rate amplifies the importance of some parameters that were not so significant in the relatively low speed recharging system of the prior art. It was, however, learned that these parameters can be effectively to realize a safe and quick recharging system without harming the cells.

In executing the charging operation for the secondary cells, however, it is important to know in advance the degree of discharge of the cell and the present residual capacity. If the charging operation is carried out without knowing the residual capacity, then, the overcharging results causing the performance of the secondary cell to be deteriorated or the life to be shortened.

Such problems become serious when the above-mentioned high-speed charging method is employed.

It has therefore been desired to provide technology for correctly measuring the present residual capacity of the secondary cell that needs be charged. At present, however, no desirable method has yet been proposed for correctly measuring the residual capacity.

According to a method of measuring the residual capacity of the secondary cell that is practically employed at the present moment, for example, the cell is discharged and the output current is measured to estimate the residual capacity of the cell. This method, however, is greatly affected by the output voltage, temperature and the kind of the cell, and fails to serve as reliable means for correctly measuring the residual capacity of the cell.

The object of the present invention is to provide a device for indicating the residual capacity of the secondary cells which is capable of measuring the residual capacity of the secondary cell such as a nickel-cadmium cell or a nickel-hydrogen cell that needs be recharged correctly and within short periods of time relying upon a simple constitution by improving the aforementioned defects inherent in the prior art, and a method of indicating the residual capacity of the secondary cells.

DISCLOSURE OF THE INVENTION

In order to accomplish the above-mentioned object, the present invention basically employs the technical constitution described below. That is, a first aspect of the present invention is concerned with a device for indicating the residual capacity comprising:

a power source feeding means for feeding a current of at least 2C rate to a secondary cell;

a cell-holding means;

a voltage-measuring means for measuring an output voltage at a terminal of said cell;

a sampling means for sampling the terminal voltage of said cell by said voltage-measuring means while the current is being fed to said cell from said power source feeding means;

a storage means for storing information specific as to the kind of the cell of which the residual capacity is to be measured and representing relationships between a group of the specific sections and a plurality of the specific voltage regions corresponding to said specific sections, said group of the specific sections being divided into a plurality of limited sections to cover the whole range of the residual capacity, and each of the sections representing individual ranges of the residual capacity of the cell;

an operation means which compares the measured voltage with the specific voltage regions divided into the plurality of the sections stored in said storage means, successively, calculates to find in which specific voltage region said measured voltage is included, and judges in which specific section among the plurality of the sections indicating the residual capacity of the cell is included the residual capacity of said cell; and an indicator means which represents information indicating a range of the residual capacity of said cell in response to the output from said operation means.

Further, a second aspect of the invention is concerned with a method of indicating the residual capacity of the secondary cells by using the device for indicating the residual capacity constituted as described above, said method of indicating the residual capacity comprising:

a first step for feeding a current of at least 2C rate from the power source feeding means to a secondary cell mounted on said device;

a second step for measuring the output voltage at the terminal of the cell based on the control operation of said sampling control means while said first step is being executed;

a third step for transmitting voltage information obtained by said second step to said operation means;

a fourth step for comparing, by said operation means, said voltage information with each of the different voltage regions that are set being corresponded to the predetermined number of the specific sections indicating the specific ranges of the residual capacity stored in the look-up table;

a fifth step for selecting a specific voltage region in said look-up table that includes said voltage information;

a sixth step for outputting information that indicates a specific section representing a specific range of the residual capacity corresponding to the specific voltage region that is selected; and a seventh step for driving an indicator means that indicates the specific section based upon output information representing the specific section in said range of the residual capacity output in said sixth step.

According to the present invention, the device for indicating the residual capacity of the secondary cells and the method of indicating the residual capacity employ the aforementioned technical constitution. By simply measuring the terminal voltage of the secondary cell that needs be recharged, therefore, the residual capacity of the secondary cell can be measured fairly correctly and the residual capacity can be concretely detected.

According to the above-mentioned system for indicating the residual capacity of the secondary cell, the voltage at the output terminal of the cell is measured while charging the cell by feeding a current of at least 2C rate thereto, and the voltage is compared by using a data table in which the voltage level of the secondary cell has been related to a range of residual capacity levels.

BRIEF DESCRIPTION OF DRAWINGS

FIG. 3 is a diagram illustrating the outline of a look-up table used for the device for indicating the residual content according to the present invention;

FIG. 4 is a diagram illustrating a concrete example of the look-up table according to the present invention;

BEST MODE FOR CARRYING OUT THE INVENTION

Figure 1:
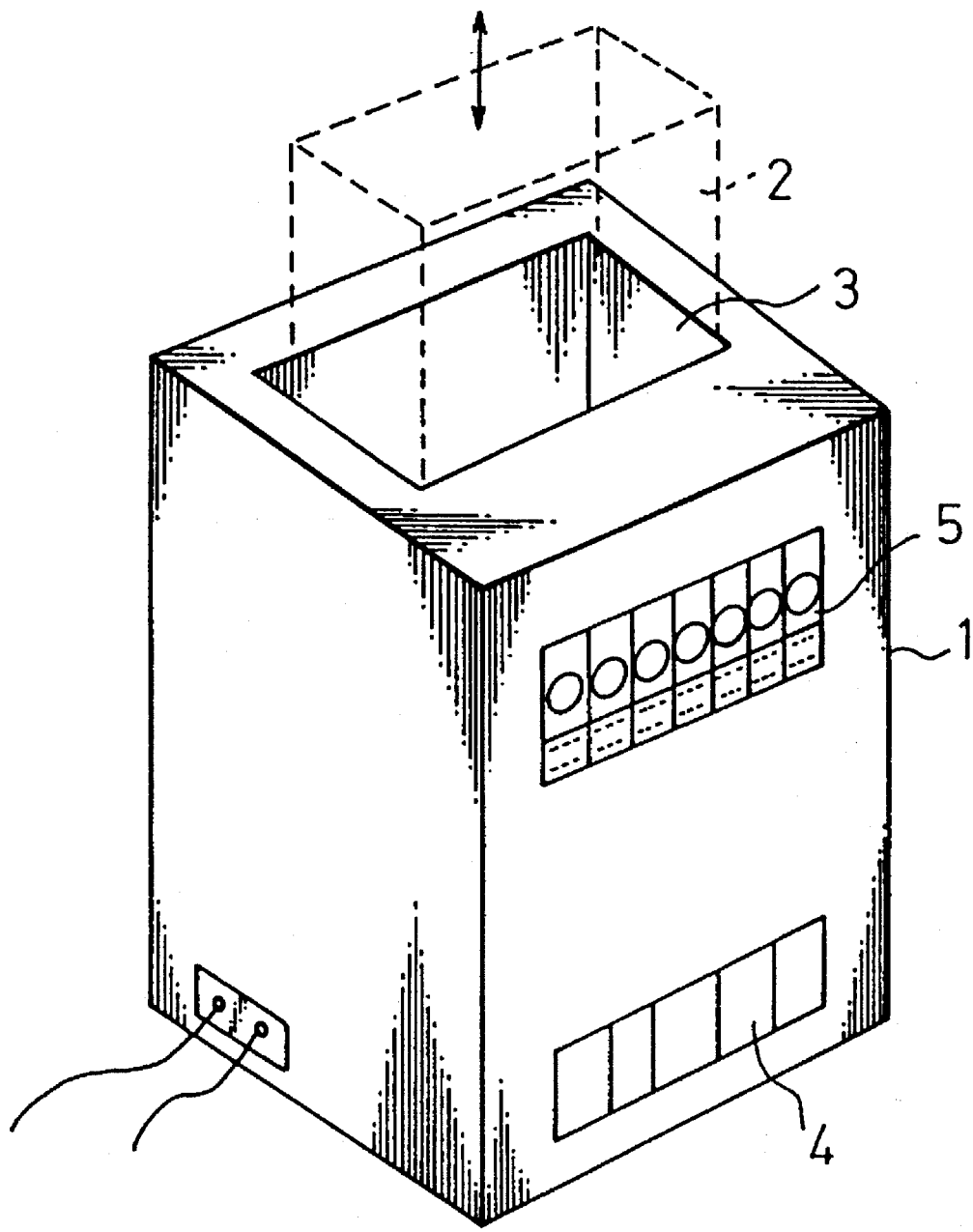
FIG. 1 is a perspective view illustrating the appearance of the device for indicating the residual cpacity according to the present invention.

Described below in detail with reference to the drawings are concrete examples of the device for indicating the residual capacity of a secondary cell such as a nickel-cadmium cell or a nickel-hydrogen cell and a method of indicating the residual capacity according to the present invention.

The capacity of a cell has generally been defined in terms of the amount of energy which can be emitted by the cell over a predetermined period of time, i.e., defined in terms of its energy storage ability, without bringing the voltage into consideration.

The reason for this is probably because the voltage of the cell has been fixed throughout its charging period depending upon the chemical composition which is a decisive factor related to the voltage.

For instance, a secondary cell has a voltage which is fixed to about 1.2 V, a carbon-zinc cell has a voltage of about 1.5 V, and a lithium cell has a voltage of about 3.0 V, thus being different from one another.

In practice, however, the voltage undergoes a change depending upon the amount of current flowing out. In the case of a secondary cell such as the nickel-cadmium cell, therefore, the voltage is directly related to the amount of current that flows not only during the charging period but also during the discharging period.

The sole correct method of determining the residual capacity of the cell is to measure the energy of discharge by really discharging the cell.

So far, therefore, the residual capacity of the cell has, generally, been measured not by measuring the voltage but by chiefly measuring the current in a state where the cell is being discharged and converting it into the energy of discharge to estimate the residual capacity.

Through keen study concerning the method of measuring the residual capacity of the cells, the present inventors have paid attention to the internal resistance of the cell at the time of measuring the residual capacity and have discovered, through experiments, the fact that the internal resistance of the nickel-hydrogen cell or the like cell does not exhibit a large change during the discharge but exhibits singular characteristics during the charge and exhibits a particularly distinguished singularity when it is charged at a high rate by using a large current of, for example, 2C rate or greater.

That is, it was found that a secondary cell such as the nickel-cadmium cell exhibits an internal resistance which is high when the residual capacity is small but which is low when the residual capacity is large.

Since the voltage at the output terminal of the secondary cell such as the nickel-cadmium cell or the nickel-hydrogen cell exhibits such a change, the residual capacity can be easily learned by converting an analog signal obtained from a circuit means that measures the voltage at the output terminal of the cell into a digital signal using an analog-to-digital converter, and by manipulating the digital signal using a suitable operation processing means such as a microprocessor.

In the present invention, a rise in the voltage at the output terminal of the nickel-cadmium cell means an increase in the residual capacity of the cell.

In principle, however, the above-mentioned method of measuring the residual capacity of the present invention involves a problem in that the voltage at the output terminal of the secondary cell is not linear throughout the charging period.

That is, the voltage at the output terminal of the cell exhibits nonlinearity for a change of the residual capacity of the secondary cell of from 0% to 100%. It is therefore difficult to establish a relationship between the residual capacity of the cell and the voltage at the output terminal of the cell relying upon a simple linear equation.

According to the present invention as will be described 0below, therefore, the measured voltage at the output terminal of the cell is compared and judged using a comparison table (look-up table) of the voltages and residual capacities, that has been prepared in advance relying upon the measurement, and the residual capacity of the cell is estimated.

According to the present invention, therefore, look-up tables mentioned below are prepared for each of the secondary cells that need recharging and are stored in a suitable storage means of the device for indicating the residual capacity.

According to the present invention, the residual capacity % of a secondary cell such as a nickel-cadmium cell can be measured based on the voltage at the output terminal of the cell because of the reason that the internal resistance of the secondary cell exhibits singular characteristics, i.e., a change that varies depending upon the residual capacity of the cell when it is charged with a current of larger than 2C.

That is, in the secondary cell such as the nickel-cadmium cell or the nickel-hydrogen cell of the present invention, the voltage Vt at the output terminal of the cell during the charging operation is usually given by, $$Vt = I \times (Rc + Rrc + R)$$

wherein Rc is an ohmic resistance that varies depending upon the charging current, R is an ohmic resistance that varies depending upon the conductivity of the internal structure of the cell and upon the temperature, and Rrc is an ohmic resistance that varies depending upon the residual capacity.

Therefore, when the charging operation is carried out under the condition where the resistance components Rc and R are fixed, it will then be understood that the voltage Vt at the output terminal of the nickel-cadmium cell varies depending upon the resistance component Rrc, i.e., depending upon a change in the residual capacity.

According to the present invention, a predetermined current and, particularly, a large current of 2C rate or greater is fed to a secondary cell such as a nickel-cadmium cell that needs be charged to obtain a change in the internal resistance which is dependent upon the residual capacity. This change in the internal resistance is reflected on the voltage at the output terminal of the cell.

However, the above-mentioned relationship is specific to the secondary cell that is being charged, and different relationships must be established for other types of secondary cells having different constitutions, standards and capacities. Therefore, the look-up tables 100 must be individually prepared based upon measurement.

Next, the constitution of the device for indicating the residual capacity of the secondary cell according to the present invention will be described with reference to the case of using a nickel-cadmium cell in conjunction with FIGS. 1 to 6.

FIG. 1 is a perspective view illustrating the appearance of the device 1 for indicating the residual capacity according to the present invention, wherein a main body 1 includes an insertion port 3 at an upper portion thereof in which will be inserted a nickel-cadmium cell 2 that needs be charged, a group of operation switches 4 on a side surface thereof, and an indicator device 5 for indicating the residual capacity of the cell.

Figure 2:
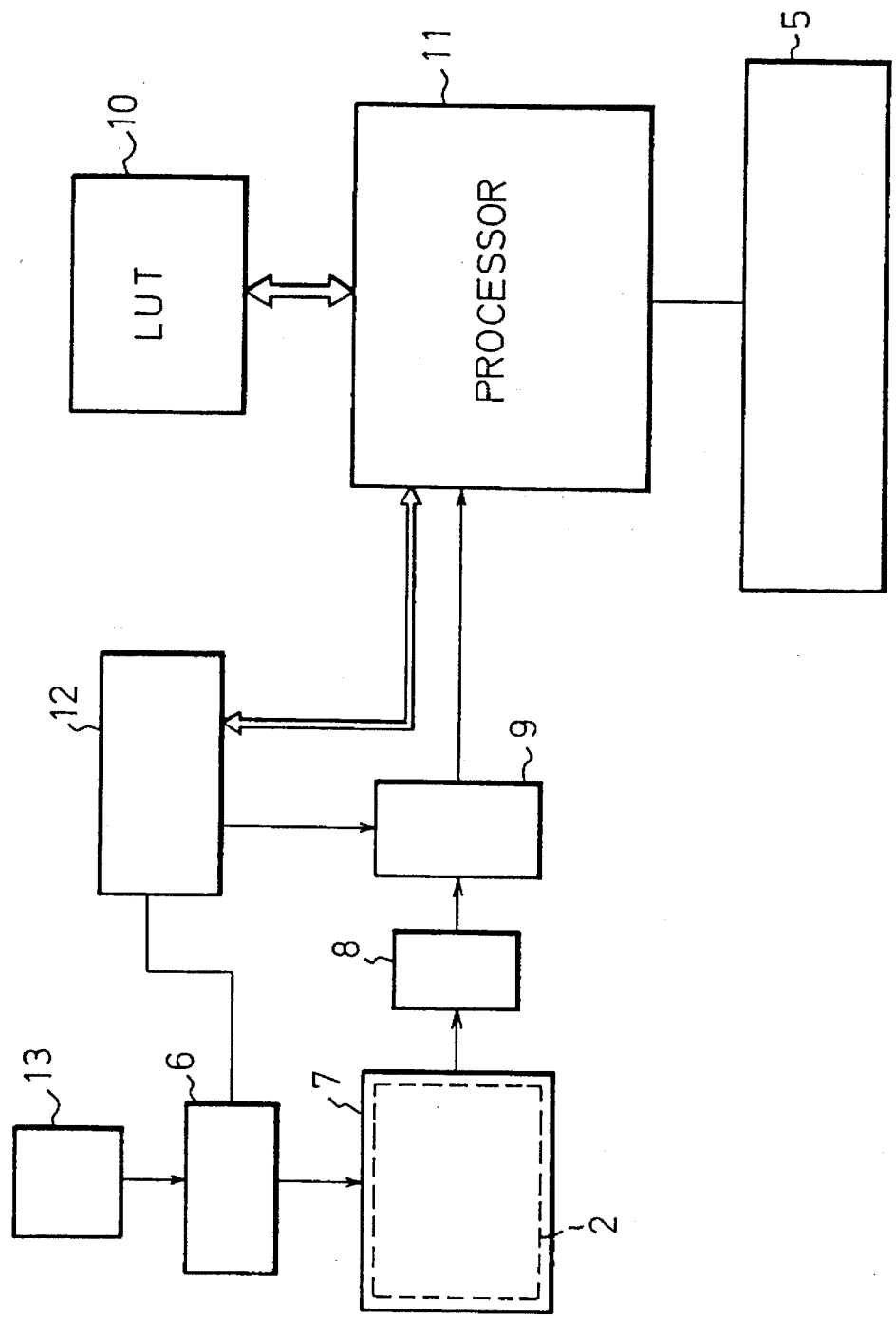
FIG. 2 is a block diagram illustrating the constitution of the device for indicating the residual capacity according to the present invention.

FIG. 2 is a block diagram illustrating the internal constitution of the device for indicating the residual capacity according to the present invention.

That is, FIG. 2 illustrates a device 1 for indicating the residual capacity comprising:

a power source feeding means 6 for feeding a current of at least 2C rate to a secondary cell 2;

a cell-holding means 7;

a voltage-measuring means 8 for measuring an output voltage at a terminal of said cell;

a sampling means 9 for sampling the terminal voltage of said cell 2 by said voltage-measuring means 8 while the current is being fed to said cell from said power source feeding means 6;

a storage means 10 for storing information specific to the kind of the cell 2 of which the residual capacity is to be measured and representing relationships between a group of the specific sections and a plurality of the specific voltage regions corresponding to said specific sections, said group of the specific sections being divided into a plurality of limited sections to cover the whole range of the residual capacity, and each of the sections representing individual ranges of the residual capacity of the cell;

an operation means 11 which compares the measured voltage with the specific voltage regions divided into the plurality of the sections stored in said storage means 10, successively, calculates to find in which specific voltage region said measured voltage is included, and judges in which specific section among the plurality of the sections indicating the residual capacity of the cell is included the residual capacity of said cell; and an indicator means 5 which represents information indicating a range of residual capacity of said cell 2 in response to the output from said operation means 11.

Furthermore, the present invention should desirably include an operation control means 12 which is constituted by, for example, a microcomputer to intensively manage and control the aforementioned means, and a current adjusting means 13 which suitably selects and adjusts the rate of the current that is fed to the cell 2 from the power source feeding means 6.

It is further desired that the storage means 10 is provided with a look-up table selection means 14 for selecting a look-up table 100 best suited for the nickel-cadmium cell 2 that is to be charged out of a plurality of look-up tables 100 stored in the storage means.

According to the present invention, the current feeding means 6 feeds a current of at least 2C to the cell 2 that is being charged, the rate of the current being selected by the current adjusting means 13 so as to be best suited for the nickel-cadmium cell 2 being charged.

Concretely speaking, a current of 2C or greater, i.e., a current of 3C, 4C or 5C is fed for a rated current of the nickel-cadmium cell.

According to the present invention, therefore, the rate of the current fed to the cell during the charging operation must be adjusted to an optimum value depending upon the rated values of the cell inclusive of the constitution, output voltage and output current of the nickel-cadmium cell that needs be charged, and upon various characteristics, residual capacity and charge/discharge hysteresis. It is therefore desired to provide a current rate changing means 13 for changing the rate of the current (C rate).

According to the present invention, the voltage at the output terminal of the nickel-cadmium cell is measured by the voltage measuring means 8 while it is being charged with a current of at least 2C in response to an instruction from the sampling means 9, and the result is sent to the sampling means 9 and, as required, the voltage data is once stored in the sampling means 9.

According to the present invention, there is no particular limitation for the means for measuring the voltage at the output terminal, and any widely known voltage measuring means can be employed.

The operation means 11 according to the present invention may be any one having the aforementioned functions. If concretely mentioned, the operation means reads out from the look-up table 100 information defining a relationship between the ranges of the residual capacity and the voltage ranges that have been measured in advance in connection with the nickel-cadmium cell 2, receives information of the voltage that is now sampled, and compares them with each other.

The operation means 11 then judges in which voltage region of the look-up table the sampled voltage is included, and outputs, based on the result thereof, information that represents a range of the residual capacity related to the residual capacity of the cell that has been set being corresponded to the voltage region of the look-up table 100 that includes the above voltage.

The constitution and an example of the look-up table 100 used in the present invention are shown in FIGS. 3 and 4.

In the look-up table 100 used in the present invention as shown in, for example, FIG. 3, when the residual capacity of the nickel-cadmium cell is to be indicated over a range of from 0% to 100%, the region 110 representing the whole range of the residual capacity is divided into a suitable number n of specific sections 111, 112, 113, - - - , 11*n*, and numerical values indicating different specific ranges of the residual capacity are imparted to the specific sections 111, 112, 113, - - - , 11*n*.

That is, the specific sections are set in a manner that a first specific section 111 covers, for example, 0 to 15% of the residual capacity, a second specific section 112 covers, for example, 15 to 30% of the residual capacity, a third specific section 113 covers, for example, 30 to 45% of the residual capacity, and an n-th specific section 11*n* covers, for example, 90 to 100% of the residual capacity.

On the other hand, to the region 120 corresponding to the specific sections 110 of the look-up table are imparted specific voltage regions of the voltages at the output terminal of the nickel-cadmium cell of when it is being charged with a large current.

That is, different voltage regions are set to correspond to the specific sections; i.e., a first voltage region 121 in which the voltage is set, for example, to 8.8 to 8.9 V to correspond to the first specific section 111, a second voltage region 122 in which the voltage is set, for example, to 8.9 to 9.0 V to correspond to the second specific section 112, a third voltage region 123 in which the voltage is set to, for example, 9.0 to 9.1 V to correspond to the third specific section 113, - - - , an n-th voltage region 12*n* in which the voltage is set to, for example, 9.6 to 10.0 V to correspond to the n-th specific section 11*n*.

Figure 5:
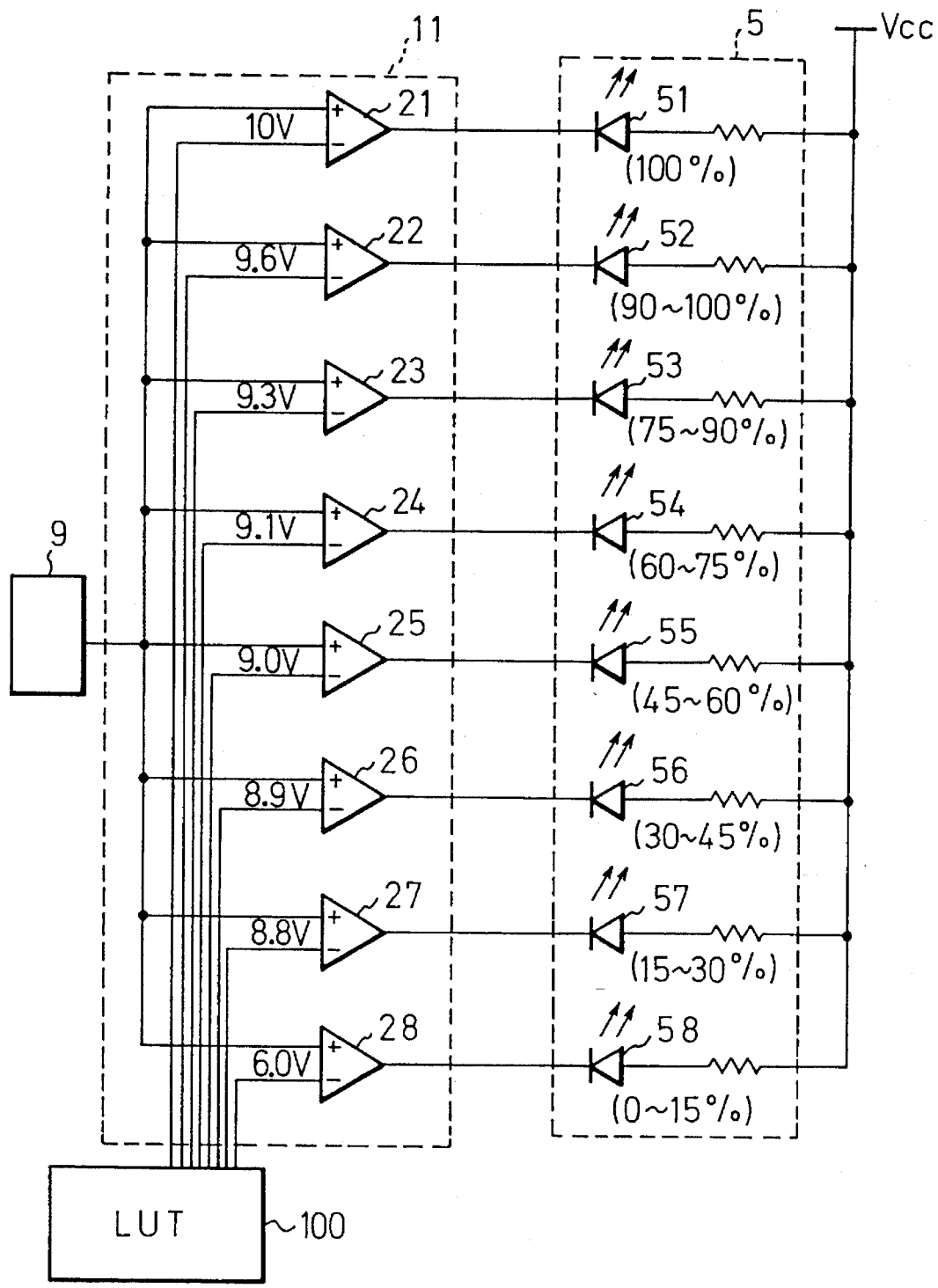
FIG. 5 is a block diagram illustrating the constitution of an operation processing circuit used in the device for indicating the residual capacity of the present invention.

FIG. 5 is a diagram illustrating the look-up table 100 used in the present invention that was prepared by practically measuring the relationship between the residual capacity % and the voltage at the output terminal in the case when a nickel-cadmium cell consisting of six cells connected in series and labelled as Panasonic P-600AARM was charged at 3C rate.

As described above, however, the nickel-cadmium cell has an internal resistance that varies depending upon the kind of the cell, the rate of the charging current (e.g., C rate), the rated capacity, etc. Therefore, the look-up table 100 used in the present invention must have been prepared in advance relying upon the measurement depending upon the kind of the nickel-cadmium cell, the rate of charging current (e.g., C rate), the rated capacity and the like.

As required, therefore, a number of look up tables 100 are prepared for use in the present invention, and are stored in a suitable storage means. Then, an optimum look-up table is selected and is used depending upon information such as the kind of the nickel-cadmium cell that is to be charged, the rate of the charging current (e.g., C rate), the rated capacity and the like.

Next, in the present invention, the above-mentioned operation means 11 has a function for comparing the measured voltage with the specific voltage regions divided into a plurality of stages stored in the storage means 10, calculates in which specific voltage region the measured voltage is included, and judges in which specific section among the plurality of sections indicating the residual capacity of the cell the residual capacity of the cell is included. There is no particular limitation on the constitution of the operation means 11.

If described more concretely, the operation means 11 carries out the operation processing to compare present voltage information measured by the voltage measuring means 8 with the voltage information stored in the storage means 10 and to judge in which specific section of the look-up table 100 the present voltage information is included, and executes a step for comparing said voltage information with each of the different voltage regions that are set being corresponded to the specific sections of a predetermined number indicating the specific ranges of the residual capacity stored in the look-up table, a step for selecting a specific voltage region in said look-up table including said voltage information, and a step for outputting information that indicates a specific section representing a specific range of the residual capacity corresponding to the specific voltage region that is selected.

When the specific sections divided into a predetermined number are arranged in the order of increasing residual capacities or decreasing residual capacities, the step that compares said voltage information with each of the different voltage regions that are set being corresponded to specific sections stored in the look-up table, works to select the measured voltage information starting from one end of the arrangement of the specific sections in the look-up table, i.e., in the order of increasing residual capacities or decreasing residual capacities, and compares them with the specific regions in the order of increasing residual capacities or decreasing residual capacities.

The operation means 11 according to the present invention may employ a circuit constitution fabricated in a hardware fashion by combining specific circuits or may execute the arithmetic operation in a software fashion by using a particular program.

FIG. 5 is a block diagram illustrating a hardware circuit constitution of the operation means 11 which constitutes the device 1 for indicating the residual capacity of the nickel-cadmium cell according to the present invention.

In the concrete example of FIG. 5, the operation means 11 has differential amplifier circuits 21 to 28 constituting a plurality of comparator circuit, and non-inverting input terminals of the differential amplifier circuits are connected to the output of the sampling means 9 that receive voltage information from the voltage measuring device 8 which measures the voltage at the output terminal of the nickel-cadmium cell 2 of which the residual capacity is to be measured. Moreover, inverting input terminals of the differential amplifier circuits are connected to output terminals of the look-up table.

Concretely speaking, the inverting input terminal of the differential amplifier circuit 21 is connected to a 10-V output voltage terminal among the output terminals of the look-up table, the inverting input terminal of the differential amplifier circuit 22 is connected to a 9.6-V output voltage terminal among the output terminals of the look-up table, the inverting input terminal of the differential amplifier circuit 23 is connected to a 9.3-V output voltage terminal among the output terminals of the look-up table, the inverting input terminal of the differential amplifier circuit 24 is connected to a 9.1-V output voltage terminal among the output terminals of the look-up table, the inverting input terminal of the differential amplifier circuit 25 is connected to a 9.0-V output voltage terminal among the output terminals of the look-up table, the inverting input terminal of the differential amplifier circuit 26 is connected to a 8.9-V output voltage terminal among the output terminals of the look-up table, the inverting input terminal of the differential amplifier circuit 27 is connected to a 8.8-V output voltage terminal among the output terminals of the look-up table, and the inverted input terminal of the differential amplifier circuit 28 is connected to a 6.0-V output voltage terminal among the output terminals of the look-up table.

The above example has illustrated the constitution of the operation means 11 in the case when the residual capacity of the nickel-cadmium cell, Panasonic P-600AARM of the 3C rate, was measured by using the look-up table shown in FIG. 4 while charging it with a current of 3C rate.

Therefore, the differential amplifier circuit 21 monitors a specific section of 90 to 100% of the residual capacity in the look-up table 100 of FIG. 4. When the sampled voltage of the nickel-cadmium cell lies, for example, within a range of from 9.6 V to 10.0 V, then, the differential amplifier circuit 21 outputs a predetermined signal which turns on an indicator such as a light-emitting element 51 which may be a light-emitting diode or the like corresponding to the specific region of 90 to 100% of the residual capacity in the indicator means 5 that will be described later, thus indicating the residual capacity of the cell.

Similarly, the differential amplifier circuit 22 monitors a specific section of 75 to 90% of the residual capacity in the look-up table 100. When the sampled voltage of the cell lies, for example, within a range of from 9.3 V to 9.6 V, then, the differential amplifier circuit 22 outputs an output signal which turns on an indicator 52 corresponding to the specific region of 75 to 90% of the residual capacity in the indicator means 5, thus indicating the residual capacity of the cell.

Furthermore, the differential amplifier circuit 23 monitors a specific section of 60 to 75% of the residual capacity in the look-up table 100. When the sampled voltage of the cell lies, for example, within a range of from 9.1 V to 9.3 V, then, the differential amplifier circuit 23 outputs an output signal which turns on an indicator 53 corresponding to the specific region of 60 to 75% of the residual capacity in the indicator means 5, thus indicating the residual capacity of the cell.

The differential amplifier circuits 24 to 28 are constituted in the same manner as described above, execute the operation of comparison for the measured voltages, and indicate residual capacities.

As for operating the operation means according to the present invention, the inverting input terminals of the differential amplifier circuits 21 to 28 may be connected all at one time to the outputs of the look-up table 100, or the corresponding terminals may be connected together successively using a suitable switching means.

The indicator means 5 of FIG. 5 have employed light-emitting diodes such as LEDs to indicate the residual capacity of the cell. According to the present invention, however, the indicator means 5 is not necessarily limited to the above-mentioned embodiment but may be so constituted as to indicate in numerical values the different ranges of the residual capacity set being corresponded to a predetermined number of specific sections stored in the look-up table 100 by using an indicator device of liquid crystals. Or, the indicator means 5 may be so constituted as to indicate in different colors or voices the different ranges or the groups of the residual capacity that are set being corresponded to the predetermined number of the specific sections stored in the look-up table.

Or, the indicator means may be so constituted as to indicate in different colors or voices in combination with numerical values the different ranges or the groups of the residual capacity that are set being corresponded to the predetermined number of the specific sections stored in the look-up table.

Figure 6:
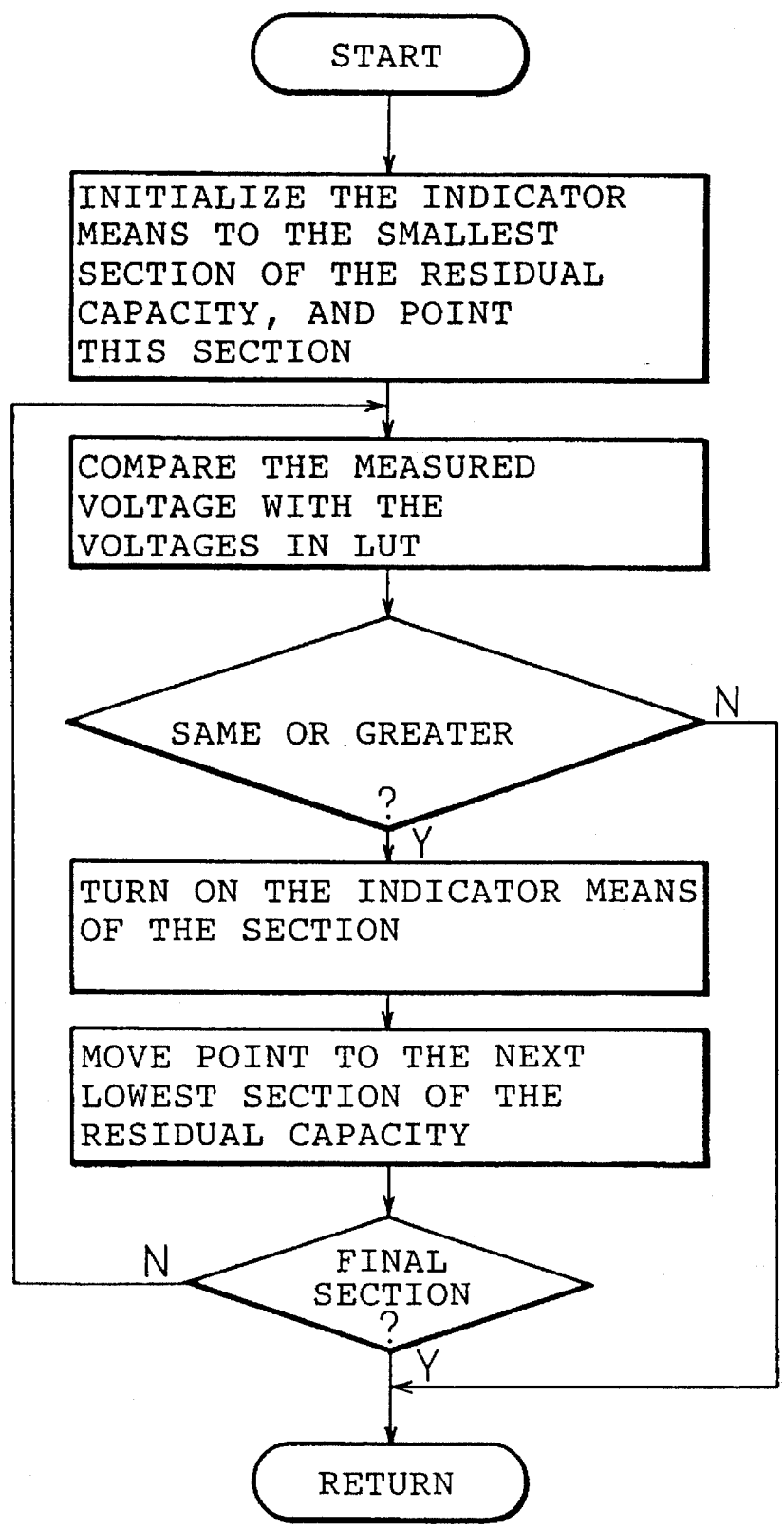
FIG. 6 is a flow chart of a program which is stored in the operation processing circuit in relation to the operation procedure for executing the method of indicating the residual capacity according to the present invention.

FIG. 6 is a flow chart illustrating a program, i.e., a procedure of operation used in the operation means 11 which is executed in a software fashion in the device for indicating the residual capacity of the nickel-cadmium cell according to the present invention.

In FIG. 6, after the start at a step 1, the indicator means, e.g., the LED is so initialized as to be corresponded to a specific section indicating the smallest region of the residual capacity in the look-up table 100, and the point is set to the lowest specific section of the residual capacity in the look-up table 100.

At a step 2, a voltage region corresponding to the set specific section of the look-up table is compared with a voltage of the nickel-cadmium cell that was measured and sampled. At a step 3, it is judged whether the sampled voltage of the cell is the same as or is greater than a value within a voltage region corresponding to the pointed specific section. When the answer is no, it is judged that the residual capacity of the nickel-cadmium cell at the present moment has not yet reached the measurable state, and the program proceeds to a step 7 and returns back to the start.

When the answer is yes at the step 3, the program proceeds to a step 4 where the indicator device corresponding to the voltage region is driven, i.e., light is emitted when the indicator device is an LED. The program then proceeds to a step 5 where the point is moved from the specific section that is being set to a voltage region corresponding to a neighboring specific section indicating a higher region of the residual capacity.

Then, at a step 6, it is judged whether the newly set voltage region has the highest voltage in the look-up table 100 and is the final specific section or not. When the answer is no, the program returns back to the step 2 to repeat the above-mentioned steps. When the answer is yes, the program proceeds to the step 7 to finish the operation. The program then returns to the start.

Figure 7:
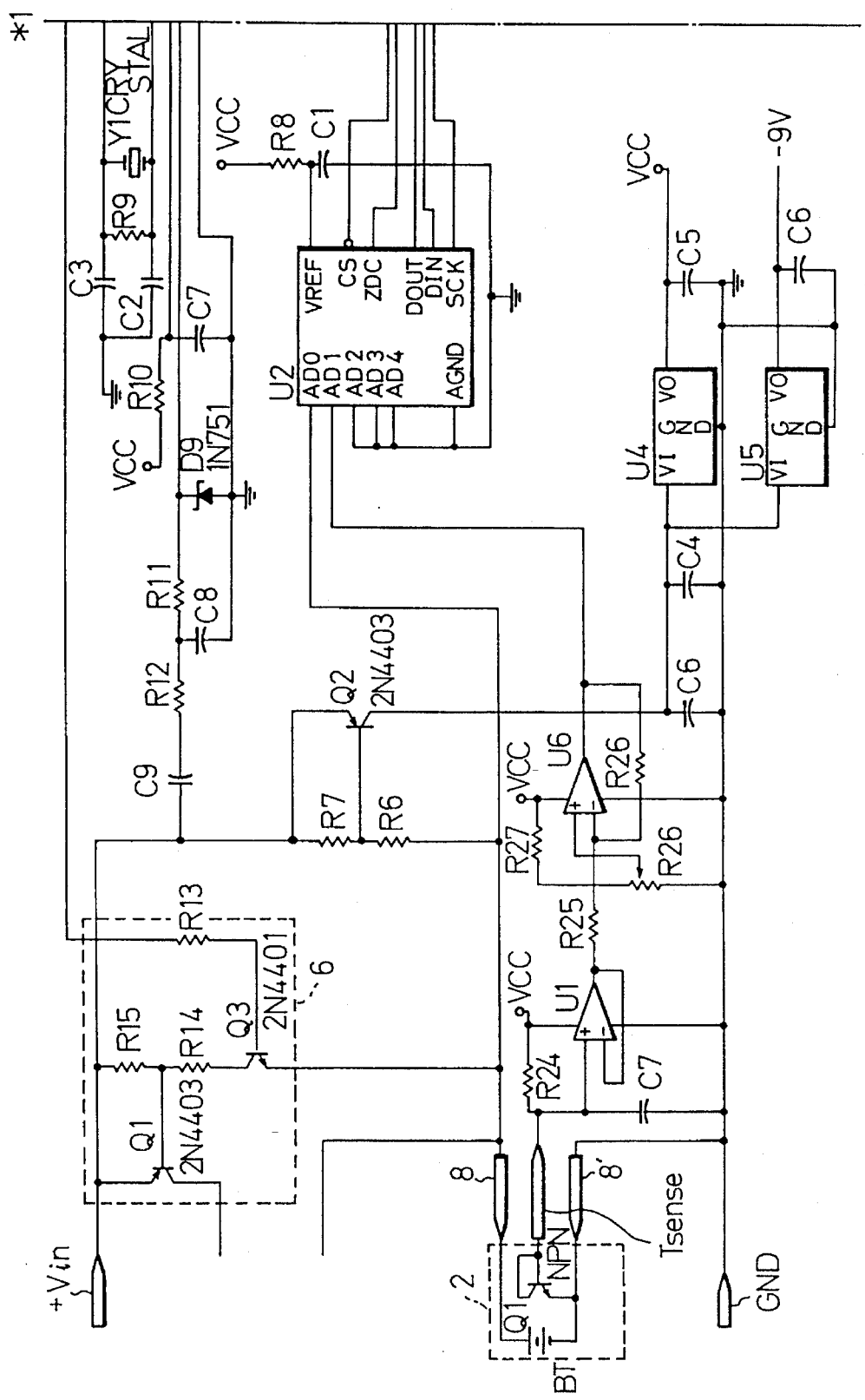
FIG. 7 is a block diagram illustrating the constitution of the whole circuit of the device for indicating the residual capacity according to the present invention.
Figure 8:
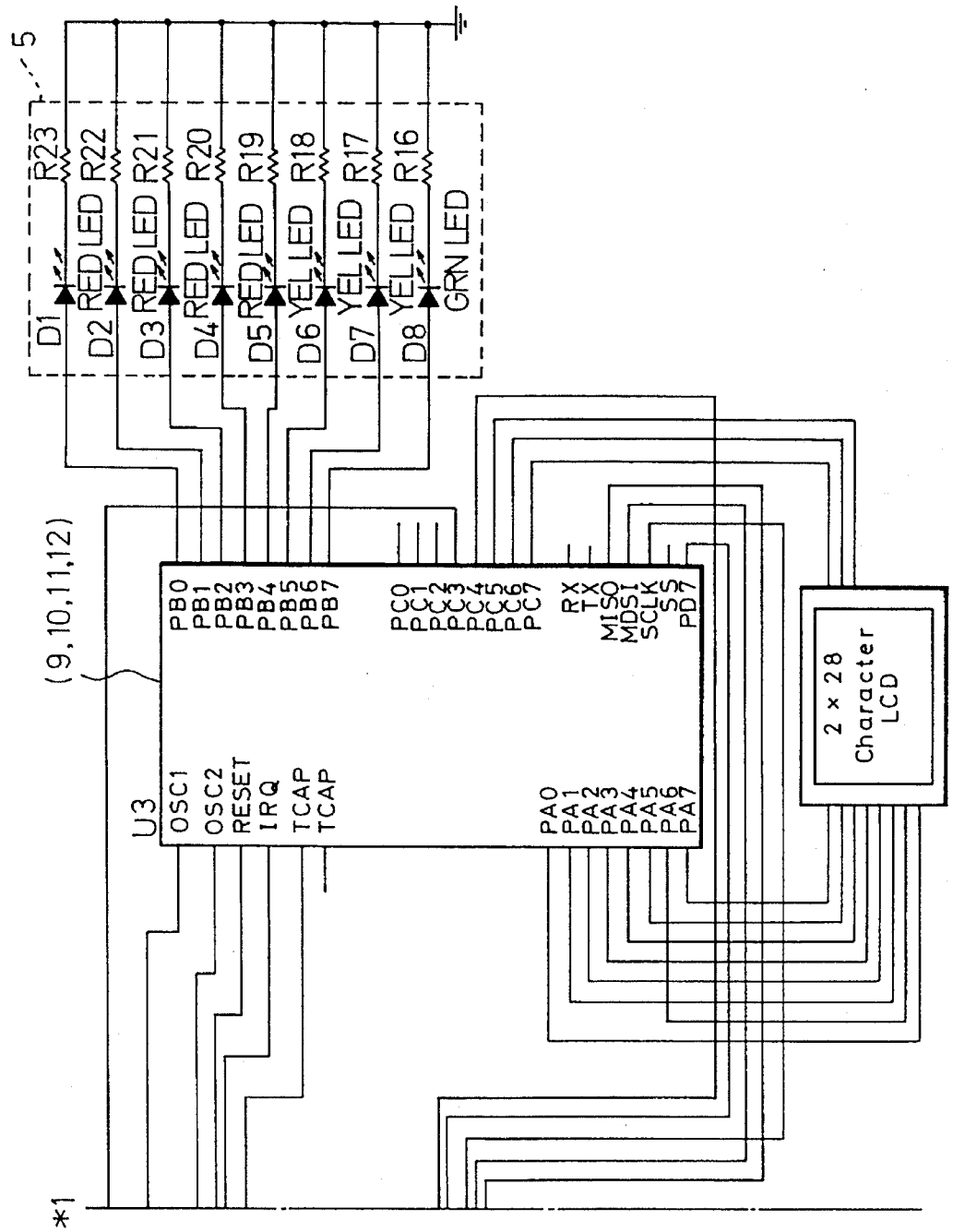
FIG. 8 is a block diagram illustrating an example of the whole circuit constitution of the device for indicating the residual capacity according to the present invention.

FIGS. 7 and 8 are block diagrams illustrating the constitution of a device for detecting the residual capacity of the cell by feeding a current of a rate higher than 2C to the nickel-cadmium cell according to the present invention.

According to this circuit, the voltage at the output terminal of the nickel-cadmium cell 2 is measured to measure the residual capacity of the cell, and the result is indicated by using light-emitting diodes that emit light of different colors depending upon the range of the residual capacity of the cell. More preferably, numerical values indicating the ranges of the residual capacity of the cell, such as 30–45% should be provided at positions where the light-emitting diodes are arranged.

In FIGS. 7 and 8, symbol BT1 denotes a nickel-cadmium cell 2 that will be recharged with a charging current fed from a power source feeding means 6 constituted by resistors R14, R15, a PNP transistor Q1 and an NPN transistor Q3. The output terminals of the cell 2 are equipped with voltage measuring devices 8, 8' for measuring the output voltage of the cell. The voltage measured by the voltage measuring device 8 is input to a first channel (AD0) of a 10-channel analog-to-digital converter U2.

The analog-to-digital converter U2 converts the input signal from the analog form into a digital form that is suited for being input to an IC microcontroller U3 that contains the operation means 11 of the present invention having RAM, ROM and I/O ports, and further contains the storage means 10, operation control means 12 and sampling means 9. The microcontroller U3 reads the digital data signal from the analog-to-digital converter U2, processes the data, compares the measured voltage with voltage information of the look-up table stored in the storage means 10, judges the range of the residual capacity of the cell, and indicates the result by turning on or flashing one of the LEDs in the indicator means 5 consisting of a plurality of LEDs.

The microcontroller U3 may be so constituted as to digitally indicate the residual capacity of the cell on a liquid crystal indicator device 100 of, for example, 2×28 characters provided as another indicator means.

In the device 1 for indicating the residual capacity of this embodiment, the NPN transistor Q3 in the power source feeding means 6 is controlled by the IC microcontroller U3, and the terminal of the cell 2 is supplied with a current from a terminal +Vin, the current being adjusted to a predetermined C rate by a high-potential power source.

The NPN transistor Q3 is controlled by the aforementioned IC microcontroller U3. When the residual capacity of the cell that is being charged has reached 100%, the NPN transistor Q3 is turned off by a signal output from the IC microcontroller U3, and the supply of current to the cell 2 is interrupted.

A fixed voltage adjustor U4 is a constant voltage generating circuit that supplies a voltage signal Vcc adjusted to be fed to the IC microcontroller U3, to the analog-to-digital converter U2 and the like, and is connected to the power source feeding means 6 via a PNP transistor Q2.

When the cell $BT_1$ exists, therefore, the PNP transistor Q2 works as a switch for coupling to the voltage adjustor U4 an input power that is fed across the terminal +Vin and GND. When there no cell exists, the PNP transistor Q2 disconnects the coupling of the input power to the voltage adjustor U4.

Tabulated below are the specifications of the electronic parts which are the circuit components used in FIGS. 7 and 8.

| Symbol | Component |
|---|---|
| BT1 | battery |
| C1, C7 | 1 µF |
| C2, C3 | 22 pF |
| C4 | 0.001 µF |
| C5, C6, C9 | 10 µF |
| C6 | 1000 µF |
| C7 | 0.01 µF |
| C8 | 0.33 µF |
| D1, D2, D3, D4 | red LEDs |
| D5, D6, D7 | yellow LEDs |
| D8 | green LED |
| D9 | 1N751 |
| Q1 | NPN |
| Q1, Q2 | 2N4403 |
| Q3 | 2N4401 |
| R6, R7 | 200 Ω |
| R8, R10, R15 | 10 KΩ |
| R9 | 10 MΩ |
| R11, R12 | 1 KΩ |
| R13 | 2.2 KΩ |
| R14 | 4.7 KΩ |
| R16, R17, R18, R19, R20, R21, R22, R23 | 680 Ω |
| R21, R22, R23, R24 | 110 KΩ |
| R25 | 2.7 KΩ |
| R26 | 50 KΩ |
| R27, R28 | 100 KΩ |
| U1, U6 | LM358 |
| U2 | 145053 |
| U3 | 68HC705C8 |
| U4 | LM78L05 |
| U5 | LM78L08 |
| Y1 | quartz oscillator |
| Indicator device: 5 Optrex DMC16230 | liquid crystal indicator |

Having the technical constitution as described above, the device for indicating the residual capacity and the method of indicating the residual capacity of the present invention make it possible to measure and indicate the residual capacity of the nickel-cadmium cell that needs be recharged correctly and within short periods of time, offering such an advantage that the charging operation can be carried out correctly, properly and quickly.

As described above, furthermore, the device for indicating the residual capacity and the method of indicating the residual capacity of the present invention can be used even for such secondary cells as nickel-hydrogen cells and the like in addition to the nickel-cadmium cells.

I claim:

1. A device for indicating residual capacity comprising:
   a power source feeding means for feeding a current of at least 2C rate to a secondary cell;
   a cell-holding means;
   a voltage-measuring means for measuring an output voltage at the terminals of said cell;
   a sampling means for sampling the terminal voltage of said cell by said voltage-measuring means while the current is being fed to said cell from said power source feeding means;
   a storage means for storing information specific to the kind of the cell of which the residual capacity is to be measured and representing relationships between a group of specific sections and a plurality of specific voltage regions corresponding to said specific sections, said group of specific sections being divided into a plurality of limited sections to cover the whole range of residual capacity, and each of the sections representing individual ranges of the residual capacity of the cell;
   an operation means which compares the measured voltage with the specific voltage regions divided into the plurality of the sections stored in said storage means, successively, calculates to find in which specific voltage region said measured voltage is included, and judges in which specific section among the plurality of the sections indicating the residual capacity of the cell is included the residual capacity of said cell; and
   an indicator means which represents information indicating a range of the residual capacity of said cell in response to the output from said operation means.

2. A device for indicating the residual capacity according to claim 1, wherein said power source feeding means is so constituted as to arbitrarily select a current feeding rate (C rate) from a plurality of current feeding rate (C rate) modes.

3. A device for indicating the residual capacity according to claim 1, wherein a specific section indicating the specific residual capacity corresponds to a specific voltage region.

4. A device for indicating the residual capacity according to claim 1, wherein said voltage is measured while said cell is being electrically charged with a current as large as 2C or greater.

5. A device for indicating the residual capacity according to claim 1, wherein said operation means stores a table which comprises:
   data of a group of sections which are specific to the kind of the cell of which the residual capacity is to be measured, the whole range of the residual capacity being divided into a plurality of limited sections, and the individual sections being so set as to represent the individual ranges of the residual capacity of the cell; and
   data of a group of voltage regions in which are set a plurality of specific voltage regions corresponding to the group of said specific sections.

6. A device for indicating the residual capacity according to claim 5, wherein said table is prepared for each of the kinds of the cells of which the residual capacities are to be measured prior to measuring the residual capacities by measuring a relationship between the data of the group of the sections and the data of the group of the voltage regions, and is stored in the operation means of the device for indicating the residual capacity at a suitable moment of before measuring the residual capacity.

7. A device for indicating the residual capacity according to claim 6, wherein said table is constituted for each of the kinds of the cells of which the residual capacities are to be measured in a manner that the residual capacity is indicated over a range of from 0% to 100%, the region of indicating the residual capacity is divided into a predetermined number of specific sections, numerical values representing different specific ranges of the residual capacity are imparted to the specific sections, and different specific voltage regions correspond to the specific sections.

8. A device for indicating the residual capacity according to claim 7, wherein the data for each of the cells in the table are changed depending upon the rate of the current that is fed.

9. A device for indicating the residual capacity according to claim 6, wherein the data for each of the cells in the table are changed depending upon the rate of the current that is fed.

10. A device for indicating the residual capacity according to claim 5, wherein the data for each of the cells in the table are changed depending upon the rate of the current that is fed.

11. A device for indicating the residual capacity according to claim 1, wherein said display means is constituted by any one of a liquid crystal indicator means, a voice generating means, a light generating means.

12. A device for indicating the residual capacity according to claim 11, wherein when said indicator means is a liquid crystal indicator means and the residual capacity of said cell is indicated by using any one of a numerical value indicator, a color change indicator, a graphic indicator.

13. A device for indicating the residual capacity according to claim 11, wherein when said indicator means is a voice generating means, different voices are generated depending upon the specific sections that represent predetermined ranges of the residual capacity of the cell.

14. A device for indicating the residual capacity according to claim 11, wherein when said indicator means is a light generating means, light-emitting elements emitting different colors are arranged at the specific sections that represent predetermined ranges of the residual capacity of the cell.

15. A device for indicating the residual capacity of a nickel-cadmium cell comprising:
   a power source feeding means for feeding a current of at least 2C rate to a secondary cell;
   a cell-holding means;
   a voltage-measuring means for measuring an output voltage at the terminals of said cell held by said cell-holding means;
   a sampling means for sampling the terminal voltage of said cell by said voltage-measuring means;
   a storage means for storing a look-up table which, when the residual capacity of said cell is to be indicated over a range of from 0% to 100%, is so constituted that said region for indicating the residual capacity is divided into a predetermined number of the specific sections, numerical values are imparted to the specific sections to indicate different specific ranges of the residual capacity, and different specific voltage regions are corresponded to said specific sections;

an operation means which compares the present voltage information measured by the voltage measuring means with the voltage information stored in said storage means and judges in which specific section in said look-up table the present voltage information is included;

an indicator means which indicates the range of the residual capacity which corresponds to any one of the plurality of the specific sections in said look-up table in response to the output of said operation means; and an operation control means which controls the operations of said means.

16. A device for indicating the residual capacity according to claim 15, wherein said indicator means is so constituted as to directly indicate by numerical values the different specific ranges of the residual capacity that are set to correspond to the predetermined number of the specific sections stored in said look-up table.

17. A device for indicating the residual capacity according to claim 15, wherein said indicator means is so constituted as to indicate by different colors or voices the different specific ranges or groups of the residual capacity that are set to correspond to the predetermined number of the specific sections stored in said look-up table.

18. A device for indicating the residual capacity according to claim 15, wherein said indicator means is so constituted as to indicate by different colors or voices the different specific ranges or groups of the residual capacity that are set to correspond to the predetermined number of the specific sections stored in said look-up table in combination with numerical values indicating the specific ranges of the residual capacity.

19. A method of indicating the residual capacity of a secondary cell by using the device for indicating the residual capacity of the secondary cell as set forth in claim 15, said method of indicating the residual capacity of the secondary cell comprising:

a first step for feeding a current of at least 2C rate from the power source feeding means to a secondary cell mounted on said device;

a second step for measuring the output voltage at the terminals of the cell based on the control operation of said sampling control means while said first step is being executed;

a third step for transmitting voltage information obtained by said second step to said operation means;

a fourth step for comparing, by said operation means, said voltage information with each of the different voltage regions that are set being corresponded to the specific sections of the predetermined number indicating the specific ranges of the residual capacity stored in the look-up table;

a fifth step for selecting a specific voltage region in said look-up table that includes said voltage information;

a sixth step for outputting information that indicates a specific section representing a specific range of the residual capacity corresponding to the specific voltage region that is selected; and a seventh step for driving an indicator means that indicates the specific section based upon output information representing a specific section in said range of the residual capacity output in said sixth step.

20. A method of indicating the residual capacity according to claim 19, wherein when the specific sections divided into a predetermined number are arranged in the order of increasing residual capacities or decreasing residual capacities, the fourth step that compares said voltage information with the different voltage regions that are set being corresponded to the specific sections stored in the look-up table, works to compare the measured voltage information with the specific sections successively starting from one end of the arrangement of the specific sections in the look-up table in the order of increasing residual capacities or decreasing residual capacities.

21. A method of indicating the residual capacity of a secondary cell by using the device for indicating the residual capacity of the secondary cell as set forth in claim 1, said method of indicating the residual capacity of the secondary cell comprising:

a first step for feeding a current of at least 2C rate from the power source feeding means to a secondary cell mounted on said device;

a second step for measuring the output voltage at the terminals of the cell based on the control operation of said sampling control means while said first step is being executed;

a third step for transmitting voltage information obtained by said second step to said operation means;

a fourth step for comparing, by said operation means, said voltage information with each of the different voltage regions that are set being corresponded to the specific sections of the predetermined number indicating the specific ranges of the residual capacity stored in the look-up table;

a fifth step for selecting a specific voltage region in said look-up table that includes said voltage information;

a sixth step for outputting information that indicates a specific section representing a specific range of the residual capacity corresponding to the specific voltage region that is selected; and a seventh step for driving an indicator means that indicates the specific section based upon output information representing a specific section in said range of the residual capacity output in said sixth step.

22. A method of indicating the residual capacity according to claim 21, wherein when the specific sections divided into a predetermined number are arranged in the order of increasing residual capacities or decreasing residual capacities, the fourth step that compares said voltage information with the different voltage regions that are set being corresponded to the specific sections stored in the look-up table, works to compare the measured voltage information with the specific sections successively starting from one end of the arrangement of the specific sections in the look-up table in the order of increasing residual capacities or decreasing residual capacities.

* * * * *